(12) United States Patent
Yeh et al.

(10) Patent No.: US 9,071,203 B2
(45) Date of Patent: Jun. 30, 2015

(54) CMOS CASCODE POWER CELLS

(71) Applicant: Taiwan Semiconductor Manufacturing Co., Ltd., Hsin-Chu (TW)

(72) Inventors: Tzu-Jin Yeh, Hsinchu (TW); Chewn-Pu Jou, Chutung (TW); Jun-De Jin, Hsinchu (TW); Hsieh-Hung Hsieh, Taipei (TW); Chia-Chung Chen, Keelung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 19 days.

(21) Appl. No.: 13/939,209

(22) Filed: Jul. 11, 2013

(65) Prior Publication Data

US 2015/0015336 A1 Jan. 15, 2015

(51) Int. Cl.
*H03F 3/14* (2006.01)
*H03F 3/213* (2006.01)
*H01L 21/8238* (2006.01)
*H03F 1/22* (2006.01)

(52) U.S. Cl.
CPC ............ *H03F 3/213* (2013.01); *H01L 21/8238* (2013.01); *H03F 1/223* (2013.01); *H01L 2924/3011* (2013.01)

(58) Field of Classification Search
CPC .................. H01L 2924/00; H01L 21/823807; H01L 21/84; H01L 27/092; H03F 1/223; H03F 1/26; H03F 2200/162; H03F 2200/357; H03F 2200/61; H03F 2203/21178; H03F 2203/7215; H03F 3/087; H03F 3/195; H03F 3/21

USPC .................................................. 330/307, 311
See application file for complete search history.

(56) References Cited

U.S. PATENT DOCUMENTS

| | | | | |
|---|---|---|---|---|
| 7,378,912 B2* | 5/2008 | Tanahashi et al. | ............ | 330/311 |
| 7,969,243 B2* | 6/2011 | Bracale et al. | ................ | 330/277 |
| 8,466,747 B1* | 6/2013 | Helms et al. | .................. | 330/307 |
| 8,797,104 B2* | 8/2014 | Hsieh et al. | .................... | 330/311 |

OTHER PUBLICATIONS

Ghajar, M.R. et al., "Cascode MOSFET-MESFET RF Power Amplifier on 150nm SOI CMOS Technology", Proceedings of the 6th European Microwave Integrated Circuits Conference, Oct. 2011, pp. 316-319.

* cited by examiner

*Primary Examiner* — Khanh V Nguyen
(74) *Attorney, Agent, or Firm* — Duane Morris LLP (57) ABSTRACT

A circuit includes a first CMOS device forming a gain stage of a power amplifier and a second CMOS device forming a voltage buffer stage of the power amplifier. The first CMOS device includes a first doped well formed in a substrate, a first drain region and a first source region spaced laterally from one another in the first doped well, and a first gate structure formed over a first channel region in the first doped well. The second CMOS device includes a second doped well formed in the semiconductor substrate such that the first doped well and the second is disposed adjacent to the second doped well. A second drain region and a second source region are spaced laterally from one another in the second doped well, and a second gate structure formed over a second channel region in the second doped well.

20 Claims, 10 Drawing Sheets

FIG.6

CMOS CASCODE POWER CELLS

FIELD OF DISCLOSURE

The disclosed circuits and methods relate to integrated circuits. More particularly, the disclosed circuits and methods relate to integrated circuits including power amplifiers.

BACKGROUND

Power amplifiers are used in a number of integrated circuit applications. For example, power amplifiers are typically included in mobile communication devices such as cellular phones.

DETAILED DESCRIPTION

This description of the exemplary embodiments is intended to be read in connection with the accompanying drawings, which are to be considered part of the entire written description.

Figure 1A:
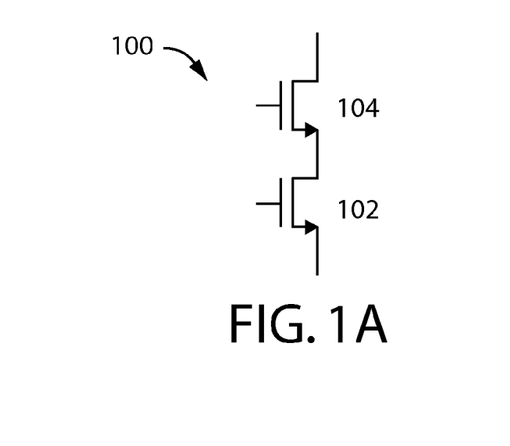
FIG. 1A is a circuit diagram of one example of a power amplifier that can be formed using CMOS technology in accordance with some embodiments.

FIG. 1A is a circuit diagram of one example of a power amplifier cell (also referred to herein as a "power amplifier," "PA," or "power cell") 100 in accordance with some embodiments. Power amplifier cell 100 includes an enhancement NMOS 102 coupled in series to a depletion NMOS 104. More particularly, enhancement NMOS 102 has its drain coupled to the source of depletion NMOS 104. Enhancement NMOS 102 is configured to provide a gain, $g_m$, and depletion NMOS 104 is configured to function as a voltage buffer stage. Advantageously, the power amplifier cell 100 can be formed using complementary metal oxide semiconductor ("CMOS") processing technology.

Figure 1B:
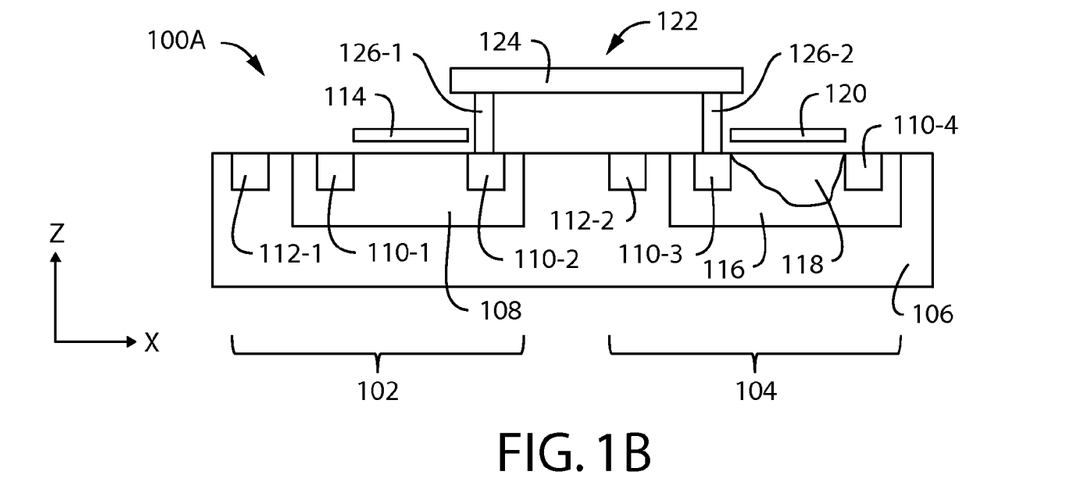
FIG. 1B is a cross-sectional view of one example of a power amplifier layout in accordance with the power amplifier illustrated in FIG. 1A.

Turning now to FIG. 1B, a cross-sectional view of one example of a power cell 100A in accordance with the circuit diagram illustrated in FIG. 1A is illustrated. As shown in FIG. 1B, enhancement NMOS 102 and depletion NMOS 104 are formed in a semiconductor substrate 106 and are laterally (e.g., in the x-direction) spaced from one another. In some embodiments, substrate 106 is a high-resistance ("Hi-R") substrate or a p-type substrate. Substrate 106 can be formed from a variety of materials including, but not limited to, bulk silicon, silicon-phosphorus (SiP), silicon-germanium (SiGe), silicon-carbide (SiC), germanium (Ge), silicon-on-insulator silicon (SOI-Si), silicon-on-insulator germanium (SOI-Ge), or combinations thereof. As used herein, "high resistance" or "Hi-R" includes resistance values at or above 100Ω. In some embodiments, a Hi-R substrate is achieved by not doping the substrate or by lightly doping the substrate. For example, undoped substrate 106 has a doping concentration of p-type doping of approximately $10^{10}$ cm$^{-3}$, and lightly doped substrate 106 has a doping concentration in a rage of approximately $10^{11}$ to $10^{15}$ cm$^{-3}$.

Enhancement NMOS 102 includes a first doped well 108 formed in the upper surface of substrate 106. In some embodiments, doped well 108 is doped with a p-type dopant to a concentration in the range of $10^{15}$ to $10^{18}$ cm$^{-3}$. Examples of suitable p-type material include, but are not limited to, boron, gallium, aluminum, or any Group III element.

A pair of doped regions 110-1, 110-2 are formed in the upper surface of well 108 and are laterally spaced from one another. In some embodiments, doped regions 110-1, 110-2 are N+ doped regions that are doped using a suitable n-type dopant to a doping concentration in the range of $10^{17}$ to $10^{20}$ cm$^{-3}$. Examples of a suitable n-type dopant include, but are not limited to, arsenic, phosphorus, antimony, or other Group V element.

A P+ doped region 112-1 is located in an upper surface of substrate 106 and is laterally spaced (i.e., in the x-direction) from well 108. In some embodiments, P+ doped regions are doped with a suitable p-type dopant to a concentration in the range of $10^{17}$ to $10^{20}$ cm$^{-3}$. As will be understood by one of ordinary skill in the art, doped regions 110-1, 110-2 form the source and drain regions of enhancement NMOS 102, respectively.

A gate structure 114, which can be formed from polysilicon, is located vertically above (i.e., in the z-direction) doped well 108. Gate structure 114 extends between doped regions 110-1 and 110-2 such that a channel region is formed in well 108 between doped regions 110-1 and 110-2.

Depletion NMOS 104 includes a doped well 116 formed in the upper surface of substrate 106 and is laterally spaced from well 108. In some embodiments, well 116 is an n-well doped to a different doping concentration than N+ doped regions 110-1, 110-2. In embodiments in which well 116 is an n-well, well 116 can be doped with a suitable n-type dopant to a concentration of $10^{15}$ to $10^{18}$ cm$^{-3}$.

A depletion region 118 is disposed between a pair of doped regions 110-3, 110-4, which are formed in the upper surface of well 116 such that doped regions 110-3, 110-4 are disposed on opposite sides of depletion region 118 and are laterally spaced from one another. In some embodiments, doped regions 110-3, 110-4 include N+ doped regions that are doped to a different concentration of an n-type dopant than well 116. Doped regions 110-3, 110-4 form the source and drain regions of depletion NMOS 104, respectively.

A P+ doped region 112-2 is located at and beneath an upper surface of substrate 106 and is laterally spaced (i.e., in the x-direction) from well 116. A gate structure 120, which can be formed from polysilicon, is located vertically above (i.e., in the z-direction) doped well 116. As shown in FIG. 1B, gate structure 120 extends between doped regions 110-3 and 110-4 over depletion region 118, which serves as the channel of depletion NMOS 104.

In some embodiments, enhancement NMOS 102 and depletion NMOS 104 are coupled together electrically by an interconnect 122. As shown in FIG. 1B, interconnect 122 includes a conductive trace 124 formed in a metal layer disposed over substrate 106 (e.g., M1, M2, M3, etc.) and a pair of vias 126-1, 126-2 that vertically extend between laterally extending conductive trace 124 and doped regions 110-2, 110-3, respectively.

Figure 1C:
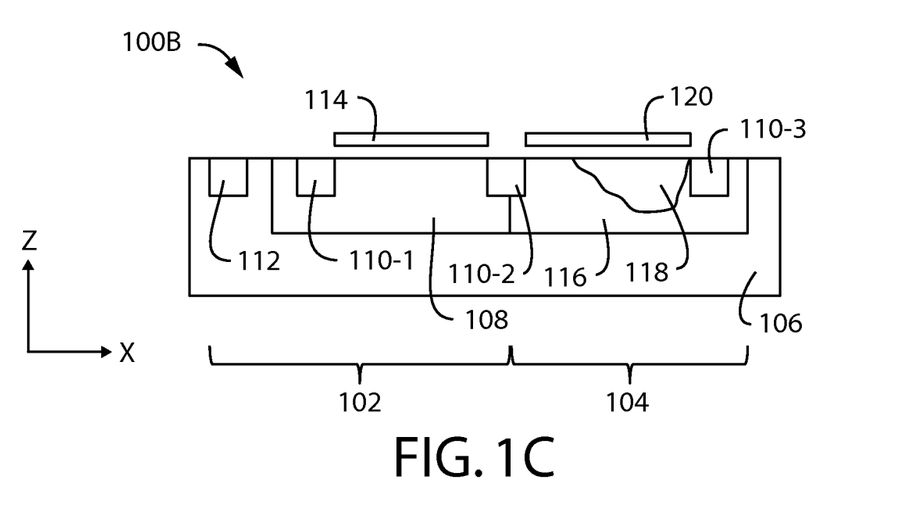
FIG. 1C is a cross-sectional view of another example of a power amplifier layout in accordance with the power amplifier illustrated in FIG. 1A.
Figure 1D:
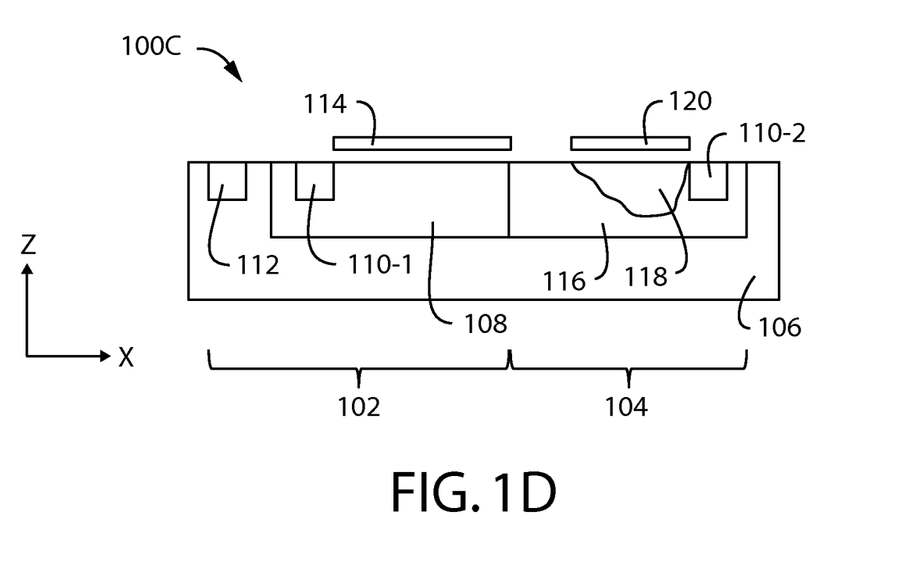
FIG. 1D is a cross-sectional view of another example of a power amplifier layout in accordance with the power amplifier illustrated in FIG. 1A.

Other layouts of power cells can be used to further reduce the substrate area of the power cell. For example, FIGS. 1C and 1D are cross-sectional views of other examples of power cells 100B, 100C, respectively. Referring first to FIG. 1C, power cell 100B includes an enhancement NMOS 102 and a depletion NMOS 104 disposed laterally adjacent to one another in an upper surface of a substrate 106. In some embodiments, substrate 106 is a Hi-R substrate or a p-type substrate.

Enhancement NMOS 102 includes a doped well 108 formed at and beneath the upper surface of substrate 106. In some embodiments, doped well 108 is doped with a p-type dopant to a doping concentration in the range of $10^{15}$ to $10^{18}$ cm$^{-3}$. A doped region 110-1 is formed at and beneath the upper surface of well 108, and a second doped region 110-2 is formed at an interface of doped well 108 and doped well 116 such that doped regions 110-1, 110-2 are laterally spaced from one another. In some embodiments, doped regions 110-1, 110-2 are N+ doped regions that are doped using a suitable n-type dopant to a concentration of $10^{17}$ to $10^{20}$ cm$^{-3}$ and form the source and drain regions of enhancement NMOS 102 respectively. Examples of a suitable n-type dopant include, but are not limited to, arsenic, phosphorus, antimony, or other Group V element. A P+ doped region 112 is located in an upper surface of substrate 106 and is laterally spaced (i.e., in the x-direction) from well 108. A gate structure 114 is located vertically above (i.e., in the z-direction) doped well 108 and extends between doped regions 110-1 and 110-2 such that a channel region is formed in well 108 between contacts 110-1 and 110-2.

Depletion NMOS 104 includes a doped well 116 formed at and beneath the upper surface of substrate 106. In some embodiments, well 116 is an n-well doped to a different doping concentration than N+ doped regions 110-1, 110-2, and 110-3. In some embodiments, well 116 is an n-well that is doped with a suitable n-type dopant to a doping concentration in the range of $10^{15}$ to $10^{18}$ cm$^{-3}$. A depletion region 118 is disposed between doped regions 110-2, 110-3. As described above, doped region 110-2 is formed at the interface between doped wells 108 and 116. Doped region 110-3 is formed in the upper surface of doped well 116 at a lateral distance from doped region 110-2. In some embodiments, doped region 110-3 is an N+ doped region that is doped to a different concentration of an n-type dopant than well 116. For example, doped region 110-3 is doped with a suitable n-type dopant to a concentration in the range of $10^{17}$ to $10^{20}$ cm$^{-3}$. Doped regions 110-2, 110-3 form the source and drain regions of depletion NMOS 104, respectively. A gate structure 120 is located vertically above (i.e., in the z-direction) doped well 116. As shown in FIG. 1C, gate structure 120 extends between doped regions 110-2 and 110-3 over depletion region 118, which serves as the channel of depletion NMOS 104. Doped region 110-2 serves as the drain of enhancement NMOS 102 and the source of depletion NMOS 104.

Referring now to FIG. 1D, power cell 100C includes an enhancement NMOS 102 and a depletion NMOS 104 disposed laterally adjacent to one another in an upper surface of a substrate 106. In some embodiments, substrate 106 is a Hi-R substrate or a p-type substrate.

Enhancement NMOS 102 includes a doped well 108 formed at and beneath the upper surface of substrate 106. In some embodiments, doped well 108 is doped with a p-type dopant to a concentration in the range of $10^{15}$ to $10^{18}$ cm$^{-3}$. A doped region 110-1 is formed in the upper surface of well 108 and forms the source of enhancement NMOS 102. In some embodiments, doped region 110-1 is an N+ doped regions that is doped using a suitable n-type dopant such as, for example, arsenic, phosphorus, antimony, or other Group V element. A P+ doped region 112 is located in at and beneath upper surface of substrate 106 and is laterally spaced (i.e., in the x-direction) from well 108. A gate structure 114 is located vertically above (i.e., in the z-direction) doped well 108 and extends between doped region 110-1 and the side of well 108 that abuts doped well 116 such that a channel region is formed in well 108 between doped region 110-1 and the interface between doped wells 108 and 116.

Depletion NMOS 104 includes a doped well 116 formed at and beneath the upper surface of substrate 106 directly adjacent to doped well 108 such that doped well 116 abuts doped well 108. In some embodiments, well 116 is an n-well doped to a lower doping concentration than N+ doped regions 110-1, 110-2. A depletion region 118 is formed in doped well 116 adjacent to a doped region 110-2. In some embodiments, doped region 110-2 is an N+ doped region that is doped to a different concentration of an n-type dopant than the concentration of n-type dopant to which well 116 is doped. Doped region 110-2 forms the drain region of depletion NMOS 104. A gate structure 120 is located vertically above (i.e., in the z-direction) doped well 116. More particularly, gate structure 120 is formed directly over depletion region 118.

Figure 2A:
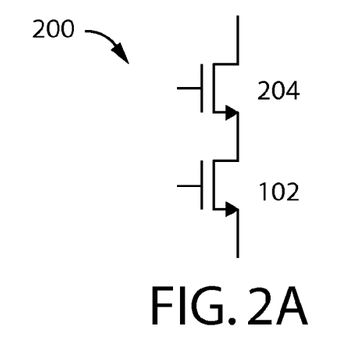
FIG. 2A is a circuit diagram of another example of a power amplifier that can be formed using CMOS technology in accordance with some embodiments.

In some embodiments, a power cell includes an enhancement NMOS and a metal semiconductor field effect transistor ("MESFET"). FIG. 2A is one example of a schematic circuit diagram of a power cell 200. As shown in FIG. 2A, power amplifier cell 200 includes an enhancement NMOS 102 coupled in series to a MESFET 204. More particularly, enhancement NMOS 102 has its drain coupled to the source of MESFET 204. Enhancement NMOS 102 is configured to provide a gain, $g_m$, and MESFET 204 is configured to function as a voltage buffer stage. Advantageously, the power amplifier cell 200 can be formed using CMOS processing technology.

Figure 2B:
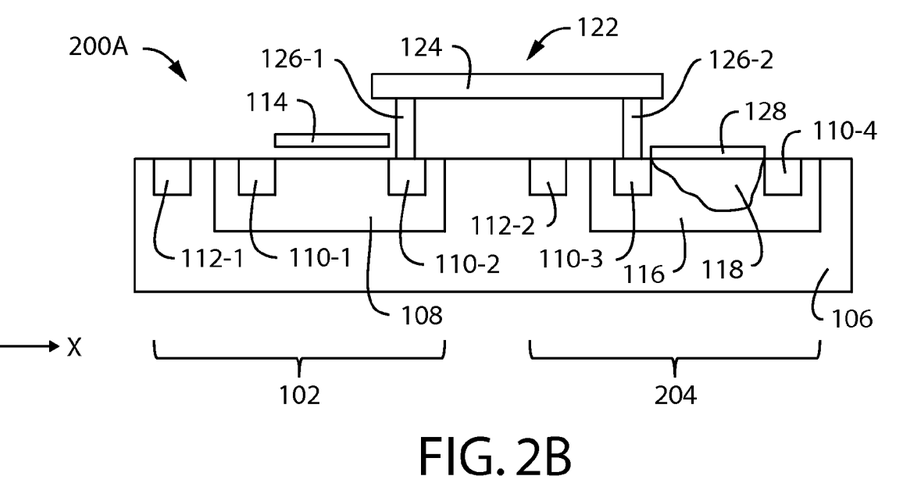
FIG. 2B is a cross-sectional view of one example of a power amplifier layout in accordance with the power amplifier illustrated in FIG. 2A.

FIG. 2B provides a cross-sectional view of one example of a power cell 200A in accordance with the circuit diagram illustrated in FIG. 2A. As shown in FIG. 2B, enhancement NMOS 102 and MESFET 204 are formed in a semiconductor substrate 106 and are laterally (e.g., in the x-direction) spaced from one another. In some embodiments, substrate 106 is a Hi-R substrate or a lightly doped p-type substrate. Substrate 106 can be formed from a variety of materials including, but not limited to, bulk silicon, SiP, SiGe, SiC, Ge, SOI-Si, SOI-Ge, or combinations thereof.

Enhancement NMOS 102 includes a first doped well 108 formed at and beneath the upper surface of substrate 106. In some embodiments, doped well 108 is doped with a p-type dopant. Examples of suitable p-type material including, but not limited to, boron, gallium, aluminum, or any Group III element. A pair of doped regions 110-1, 110-2 are formed in the upper surface of well 108 and are laterally spaced from one another. In some embodiments, doped regions 110-1, 110-2 are N+ doped regions that are doped using a suitable n-type dopant. Examples of a suitable n-type dopant include, but are not limited to, arsenic, phosphorus, antimony, or other Group V element. A P+ doped region 112-1 is located in an upper surface of substrate 106 and is spaced laterally (i.e., in the x-direction) from well 108. A gate structure 114, which can be formed from polysilicon, is located vertically above (i.e., in the z-direction) doped well 108. Gate structure 114 extends between doped regions 110-1 and 110-2 such that a channel region is formed in well 108 between doped regions 110-1 and 110-2. Doped regions 110-1, 110-2 form the source and drain regions of enhancement NMOS 102, respectively.

MESFET 204 includes a doped well 116 formed in the upper surface of substrate 106 and is laterally spaced from well 108. In some embodiments, well 116 is an n-well doped to a lower doping concentration than N+ doped regions 110-1, 110-2. A depletion region 118 is disposed between a pair of doped regions 110-3, 110-4, which are formed in the upper surface of well 116 such that doped regions 110-3, 110-4 are disposed on opposite sides of depletion region 118 and are spaced laterally from one another. In some embodiments, doped regions 110-3, 110-4 include N+ doped regions that are doped to a higher concentration of an n-type dopant than well 116. Doped regions 110-3, 110-4 form the source and drain regions of MESFET 204, respectively. A P+ doped region 112-2 is located in an upper surface of substrate 106 and is spaced laterally (i.e., in the x-direction) from well 116. A Schottky gate structure 128, which can be formed from a metal, is disposed on the upper surface of diffusion region 118 of doped well 116. Examples of suitable metals for Schottky gate structure 128 include, but are not limited to, nickel (Ni), tungsten (W), polysilicon, copper (Cu), cobalt (Co), and titanium (Ti), to list only a few possible examples. Schottky gate 128 extends between doped regions 110-3 and 110-4 over depletion region 118, which serves as the channel of MESFET 204.

In some embodiments, enhancement NMOS 102 and MESFET 204 are coupled together electrically by an interconnect 122. For example, FIG. 2B illustrates one example of an interconnect 122 that couples together enhancement NMOS 102 and MESFET 204. Interconnect 122 includes a conductive trace 124 formed in a metal layer disposed over substrate 106 (e.g., M1, M2, M3, etc.) and a pair of vias 126-1, 126-2 that vertically extend between laterally extending conductive trace 124 and doped regions 110-2, 110-3, respectively.

Figure 2C:
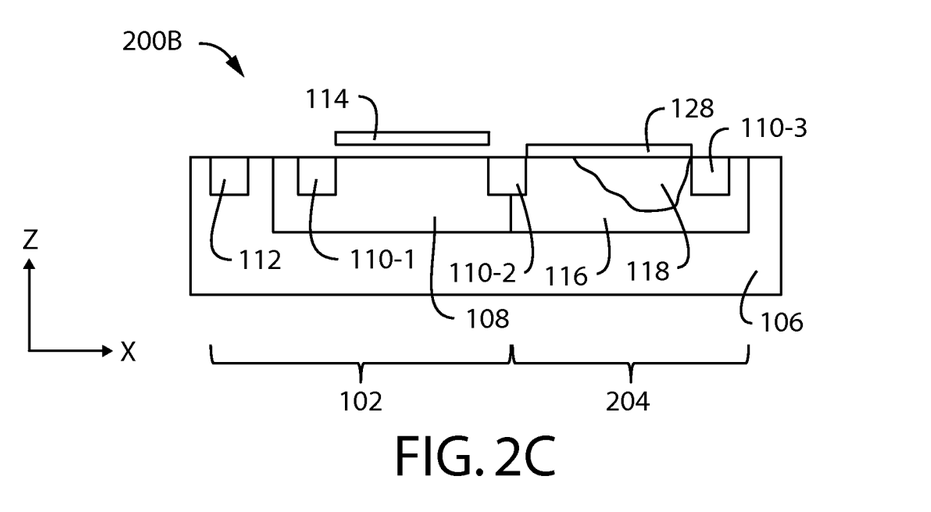
FIG. 2C is a cross-sectional view of another example of a power amplifier layout in accordance with the power amplifier illustrated in FIG. 2A.
Figure 2D:
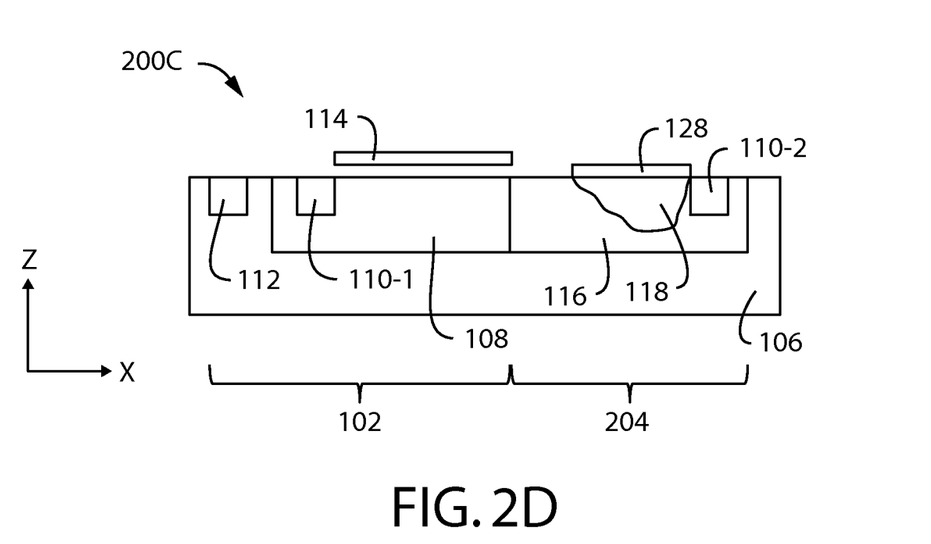
FIG. 2D is a cross-sectional view of another example of a power amplifier layout in accordance with the power amplifier illustrated in FIG. 2A.

Other layouts of power cells configured with MESFETs can be used to further reduce the substrate area of the power cell. For example, FIGS. 2C and 2D are cross-sectional views of other examples of power cells 200B, 200C, respectively. Referring first to FIG. 2C, power cell 200B includes an enhancement NMOS 102 and a MESFET 204 disposed laterally adjacent to one another in an upper surface of a substrate 106. In some embodiments, substrate 106 is a Hi-R substrate or a lightly doped p-type substrate.

Enhancement NMOS 102 includes a doped well 108 formed at and beneath the upper surface of substrate 106. In some embodiments, doped well 108 is doped with a p-type dopant to a concentration in the range of $10^{15}$ to $10^{18}$ cm$^{-3}$. A doped region 110-1 is formed in the upper surface of well 108, and a second doped region 110-2 is formed at an interface of doped well 108 and doped well 116 such that doped regions 110-1, 110-2 are spaced laterally from one another. In some embodiments, doped regions 110-1, 110-2 are N+ doped regions that are doped using a suitable n-type dopant and form the source and drain regions of enhancement NMOS 102, respectively. A P+ doped region 112 is located in an upper surface of substrate 106 and is spaced laterally (i.e., in the x-direction) from well 108. A gate structure 114 is located vertically above (i.e., in the z-direction) doped well 108 and extends between doped regions 110-1 and 110-2 such that a channel region is formed in well 108 between contacts 110-1 and 110-2.

MESFET 204 includes a doped well 116 formed at and beneath the upper surface of substrate 106. In some embodiments, well 116 is an n-well doped to a lower doping concentration than N+ doped regions 110-1, 110-2, and 110-3. In some embodiments, well 116 is an n-well that is doped with a suitable n-type dopant to a concentration in the range of $10^{15}$ to $10^{18}$ cm$^{-3}$. A depletion region 118 is disposed between doped regions 110-2, 110-3. Doped region 110-3 is formed in the upper surface of doped well 116 at a lateral distance from doped region 110-2, which is formed at the interface of doped well 108 and doped well 116. In some embodiments, doped region 110-3 is an N+ doped region that is doped to a different concentration of an n-type dopant than the concentration to which doped well 116 is doped. Doped regions 110-2, 110-3 form the source and drain regions of MESFET 204, respectively. A Schottky gate structure 128 is formed directly on the upper surface of substrate 106 over depletion region 118 of well 116. Schottky gate structure 128 extends between doped regions 110-2 and 110-3 over depletion region 118, which serves as the channel of MESFET 204. Doped region 110-2 serves as the drain of enhancement NMOS 102 and the source of MESFET 204.

Referring now to FIG. 2D, power cell 200C includes an enhancement NMOS 102 and MESFET 204 disposed laterally adjacent to one another in an upper surface of a substrate 106. In some embodiments, substrate 106 is a Hi-R substrate or a p-type substrate.

Enhancement NMOS 102 includes a doped well 108 formed in the upper surface of substrate 106. In some embodiments, doped well 108 is doped with a p-type dopant. A doped region 110-1 is formed in the upper surface of well 108 and forms the source of enhancement NMOS 102. In some embodiments, doped region 110-1 is an N+ doped region that is doped using a suitable n-type dopant such as, for example, arsenic, phosphorus, antimony, or other Group V element. A P+ doped region 112 is located in an upper surface of substrate 106 and is spaced laterally (i.e., in the x-direction) from well 108. A gate structure 114 is located vertically above (i.e., in the z-direction) doped well 108 and extends between doped region 110-1 and the side of well 108 that abuts doped well 116 such that a channel region is formed in well 108 between doped region 110-1 and the interface between doped wells 108 and 116.

MESFET 204 includes a doped well 116 formed at and beneath the upper surface of substrate 106 directly adjacent to doped well 108 such that doped well 116 abuts doped well 108. In some embodiments, well 116 is an n-well doped to a different doping concentration than N+ doped regions 110-1, 110-2. A depletion region 118 is formed in doped well 116 adjacent to a doped region 110-2. In some embodiments, doped region 110-2 is an N+ doped region that is doped to a different concentration of an n-type dopant than the concentration to which doped well 116 is doped. Doped region 110-2 forms the drain region of MESFET 204. A Schottky gate structure 128 is formed directly on the upper surface of substrate 106 over the depletion region 118 of well 116.

Figure 3A:
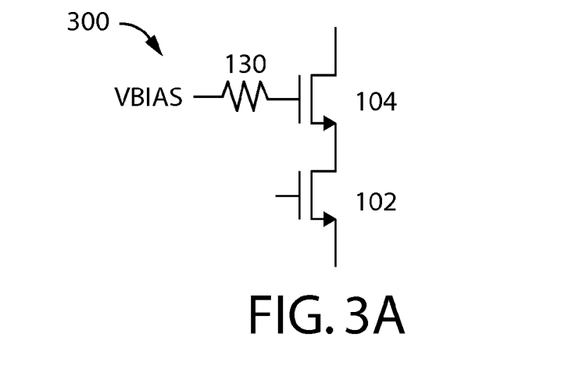
FIG. 3A is a circuit diagram of another example of a power amplifier that can be formed using CMOS technology in accordance with some embodiments.

In some embodiments, a resistor is coupled to the gate of one of the devices of a power amplifier to improve the power output of the power amplifier. For example, FIG. 3A is a schematic circuit diagram of one example of a power amplifier cell 300 configured with a resistor 130 in accordance with some embodiments. Power amplifier 300 includes an enhancement NMOS 102 coupled in series to a depletion NMOS 104. A resistor 130 is coupled to the gate of depletion NMOS 104 and to a bias voltage, VBIAS. In some embodiments, resistor 130 is a Hi-R having a resistance at or above 5 kΩ. Enhancement NMOS 102 has its drain coupled to the source of depletion NMOS 104 and is configured to provide a gain, $g_m$. Depletion NMOS 104 is configured to function as a voltage buffer stage, and Hi-R 130 is configured to prevent premature turning on of depletion NMOS 104 when the drain of depletion NMOS 104 is coupled to a high voltage potential. Advantageously, the power amplifier cell 300 can be formed using CMOS processing technology.

Figure 3B:
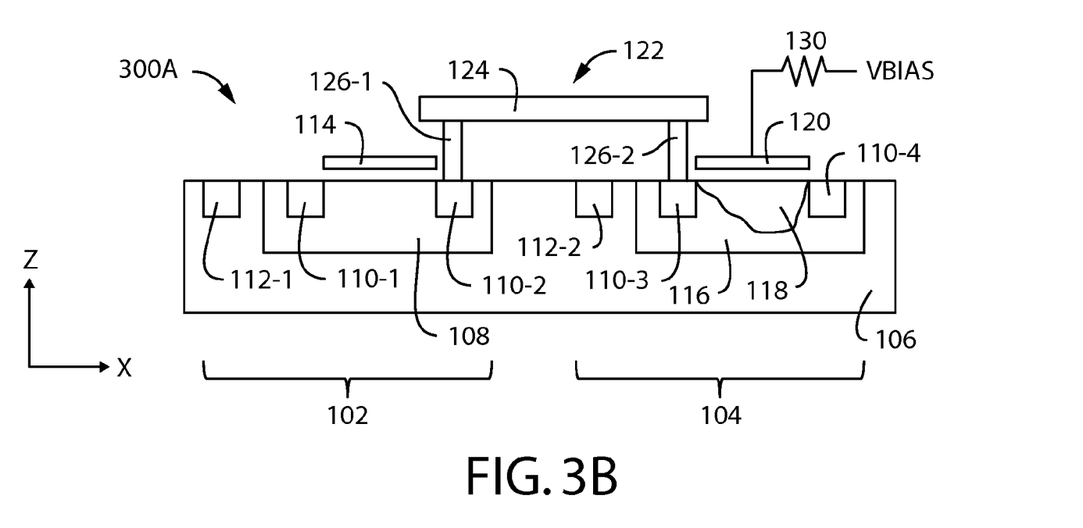
FIG. 3B is a cross-sectional view of one example of a power amplifier layout in accordance with the power amplifier illustrated in FIG. 3A.

Turning now to FIG. 3B, a cross-sectional view of one example of a power cell 300A in accordance with the circuit diagram illustrated in FIG. 3A is illustrated. As shown in FIG. 3B, enhancement NMOS 102 and depletion NMOS 104 are formed in a semiconductor substrate 106 and are spaced laterally (e.g., in the x-direction) from one another. In some embodiments, substrate 106 is a Hi-R substrate or a lightly doped p-type substrate. Substrate 106 can be formed from a variety of materials including, but not limited to, bulk silicon, SiP, SiGe, SiC, Ge, SOI-Si, SOI-Ge, or combinations thereof.

Enhancement NMOS 102 includes a first doped well 108 formed at and beneath the upper surface of substrate 106. In some embodiments, doped well 108 is doped with a p-type dopant. A pair of doped regions 110-1, 110-2 are formed in the upper surface of well 108 and are laterally spaced from one another. In some embodiments, doped regions 110-1, 110-2 are N+ doped regions that are doped using a suitable n-type dopant. A P+ doped region 112-1 is located at and beneath an upper surface of substrate 106 and is spaced laterally (i.e., in the x-direction) from well 108. A gate structure 114 is located vertically above (i.e., in the z-direction) doped well 108. In some embodiments, gate structure 114 is formed from polysilicon and extends between doped regions 110-1 and 110-2 such that a channel region is formed in well 108 between doped regions 110-1 and 110-2. Doped regions 110-1, 110-2 form the source and drain regions of enhancement NMOS 102, respectively.

Depletion NMOS 104 includes a doped well 116 formed at and beneath the upper surface of substrate 106 and is spaced laterally from well 108. In some embodiments, well 116 is an n-well doped with a suitable dopant (e.g., with an n-type dopant or a p-type dopant) to a different doping concentration than N+ doped regions 110-1, 110-2. A depletion region 118 is disposed between a pair of doped regions 110-3, 110-4, which are formed in the upper surface of well 116 such that doped regions 110-3, 110-4 are disposed on opposite sides of depletion region 118 and are spaced laterally from one another. In some embodiments, doped regions 110-3, 110-4 include N+ doped regions that are doped to a different concentration of an n-type dopant than well 116. Doped regions 110-3, 110-4 form the source and drain regions of enhancement depletion NMOS 104, respectively. A P+ doped region 112-2 is located in an upper surface of substrate 106 and is spaced laterally (i.e., in the x-direction) from well 116. A gate structure 120 is located vertically above (i.e., in the z-direction) doped well 116. In some embodiments, gate structure 120 is formed from polysilicon and extends between doped regions 110-3 and 110-4 over depletion region 118, which serves as the channel of depletion NMOS 104.

Enhancement NMOS 102 and depletion NMOS 104 are coupled together electrically by an interconnect 122. In some embodiments, interconnect 122 includes a conductive trace 124 formed in a metal layer disposed over substrate 106 (e.g., M1, M2, M3, etc.) and a pair of vias 126-1, 126-2 that vertically extend between laterally extending conductive trace 124 and doped regions 110-2, 110-3, respectively.

Resistor 130 is coupled to gate structure 120 of depletion NMOS 104. In some embodiments, resistor 130 has a high resistance and includes a floating gate structure (not shown) disposed above substrate 106. In some embodiments, resistor 130 has a resistance at or above 5 kΩ or 10 kΩ. One of ordinary skill in the art will understand that resistor 130 can have other resistance values.

Figure 3C:
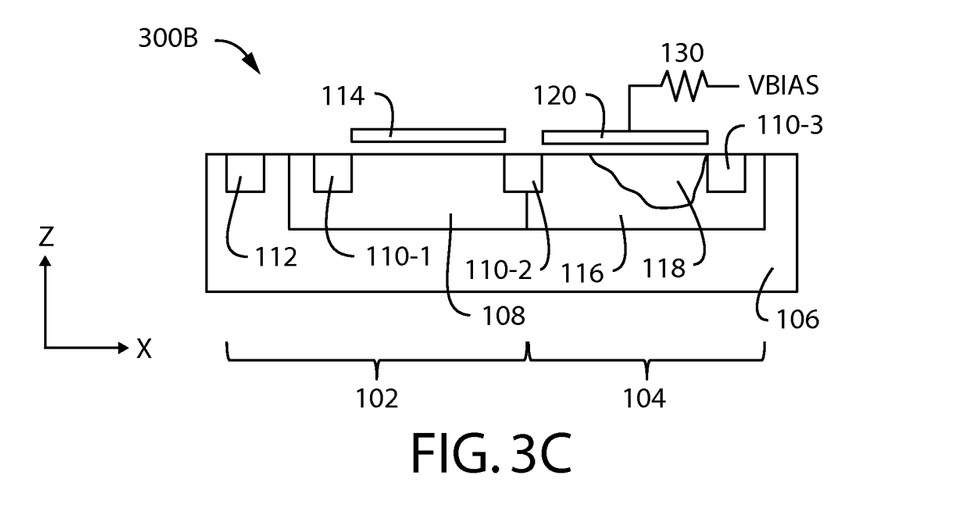
FIG. 3C is a cross-sectional view of another example of a power amplifier layout in accordance with the power amplifier illustrated in FIG. 3A.
Figure 3D:
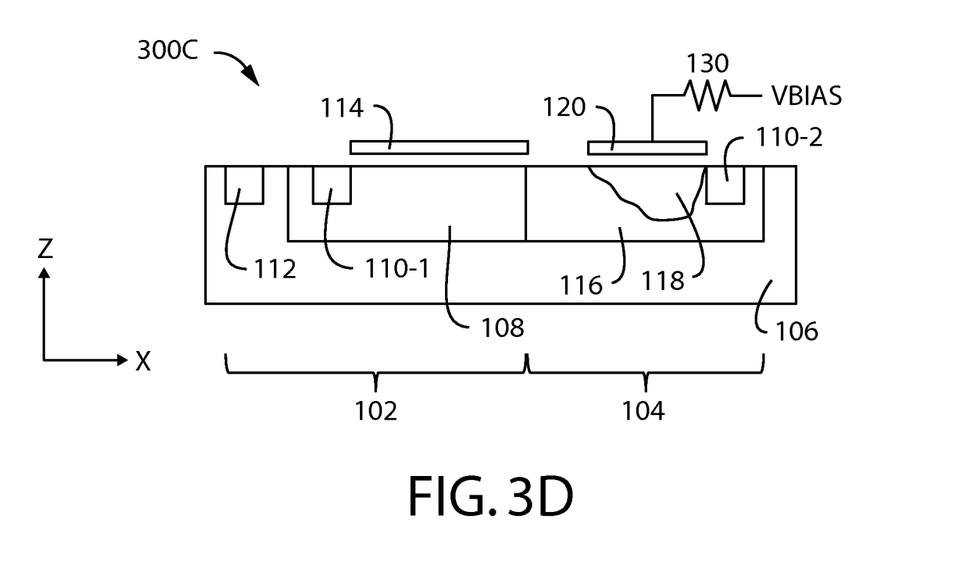
FIG. 3D is a cross-sectional view of another example of a power amplifier layout in accordance with the power amplifier illustrated in FIG. 3A.

Other layouts of power cells configured with a resistor can be used to further reduce the substrate area of the power cell. For example, FIGS. 3C and 3D are cross-sectional views of other examples of power cells 300B, 300C, respectively. Referring first to FIG. 3C, power cell 300B includes an enhancement NMOS 102 and a depletion NMOS 104 disposed laterally adjacent to one another in an upper surface of a substrate 106. In some embodiments, substrate 106 is a Hi-R substrate or a lightly doped p-type substrate.

Enhancement NMOS 102 includes a doped well 108 formed at and beneath the upper surface of substrate 106. In some embodiments, doped well 108 is doped with a p-type dopant. A doped region 110-1 is formed in the upper surface of well 108, and a second doped region 110-2 is formed at an interface of doped well 108 and doped well 116 such that doped regions 110-1, 110-2 are spaced laterally from one another. In some embodiments, doped regions 110-1, 110-2 are N+ doped regions that are doped using a suitable n-type dopant and form the source and drain regions of enhancement NMOS 102 respectively. A P+ doped region 112 is located at and beneath an upper surface of substrate 106 and is spaced laterally (i.e., in the x-direction) from well 108. A gate structure 114 is located vertically above (i.e., in the z-direction) doped well 108 and extends between doped regions 110-1 and 110-2 such that a channel region is formed in well 108 between contacts 110-1 and 110-2.

Depletion NMOS 104 includes a doped well 116 formed at and beneath the upper surface of substrate 106. In some embodiments, well 116 is an n-well doped to a different doping concentration than N+ doped regions 110-1, 110-2, and 110-3. In some embodiments, well 116 is an n-well that is doped with a suitable n-type dopant. A depletion region 118 is disposed between doped regions 110-2, 110-3. As described above, doped region 110-2 is formed at the interface between doped wells 108 and 116. Doped region 110-3 is formed at and beneath the upper surface of doped well 116 and is spaced laterally at a distance from doped region 110-2. In some embodiments, doped region 110-3 is an N+ doped region that is doped to a different concentration of an n-type dopant than well 116. Doped regions 110-2, 110-3 form the source and drain regions of depletion NMOS 104, respectively. A gate structure 120 is located vertically above (i.e., in the z-direction) doped well 116. As shown in FIG. 3C, gate structure 120 extends between doped regions 110-2 and 110-3 over depletion region 118, which serves as the channel of depletion NMOS 104. Doped region 110-2 serves as the drain of enhancement NMOS 102 and the source of depletion NMOS 104.

Resistor 130 is coupled to gate structure 120 of depletion NMOS 104. In some embodiments, resistor 130 has a high resistance and includes a floating gate structure (not shown) disposed above substrate 106. In some embodiments, resistor 130 has a resistance at or above 5 kΩ or 10 kΩ, although one of ordinary skill in the art will understand that resistor 130 can have other resistance values.

Referring now to FIG. 3D, power cell 300C includes an enhancement NMOS 102 and a depletion NMOS 104 disposed laterally adjacent to one another in an upper surface of a substrate 106. In some embodiments, substrate 106 is a Hi-R substrate or a lightly doped p-type substrate.

Enhancement NMOS 102 includes a doped well 108 formed at and beneath the upper surface of substrate 106. In some embodiments, doped well 108 is doped with a p-type dopant to a concentration in the range of $10^{15}$ to $10^{18}$ cm$^{-3}$. A doped region 110-1 is formed in the upper surface of well 108 and forms the source of enhancement NMOS 102. In some embodiments, doped region 110-1 is an N+ doped regions that is doped using a suitable n-type dopant such as, for example, arsenic, phosphorus, antimony, or other Group V element and is doped to a concentration in the range of $10^{17}$ to $10^{20}$ cm$^{-3}$. A P+ doped region 112 is located at and beneath an upper surface of substrate 106 and is laterally spaced (i.e., in the x-direction) from well 108. In some embodiments, doped region 112 is doped with a suitable p-type dopant to a concentration in the range of $10^{17}$ to $10^{20}$ cm$^{-3}$. A gate structure 114 is located vertically above (i.e., in the z-direction) doped well 108 and extends between doped region 110-1 and the side of well 108 that abuts doped well 116 such that a channel region is formed in well 108 between doped region 110-1 and the interface between doped wells 108 and 116.

Depletion NMOS 104 includes a doped well 116 formed at and beneath the upper surface of substrate 106 directly adjacent to doped well 108 such that doped well 116 abuts doped well 108. In some embodiments, well 116 is an n-well doped to a concentration in the range of $10^{15}$ to $10^{18}$ cm$^{-3}$ of a suitable n-type dopant. A depletion region 118 is formed in doped well 116 adjacent to a doped region 110-2. In some embodiments, doped region 110-2 is an N+ doped region that is doped to a different concentration of an n-type dopant than the concentration to which well 116 is doped. Doped region 110-2 forms the drain region of depletion NMOS 104. A gate structure 120 is located vertically above (i.e., in the z-direction) doped well 116. More particularly, gate structure 120 is formed directly over depletion region 118.

A resistor 130 is coupled to gate structure 120 of depletion NMOS 104. In some embodiments, resistor 130 has a high resistance and includes a floating gate structure (not shown) disposed above substrate 106. In some embodiments, resistor 130 has a resistance at or above 5 kΩ or 10 kΩ, although one of ordinary skill in the art will understand that resistor 130 can have other resistance values.

Figure 4A:
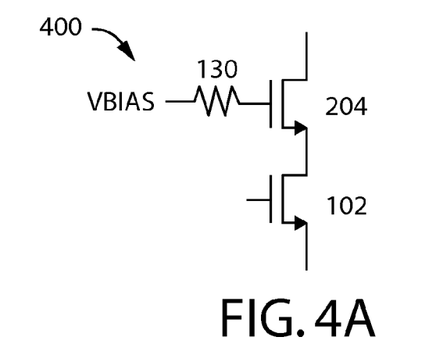
FIG. 4A is a circuit diagram of another example of a power amplifier that can be formed using CMOS technology in accordance with some embodiments.

In some embodiments, a power cell includes an enhancement NMOS, a MESFET, and resistor for biasing the gate of the MESFET. FIG. 4A is one example of a schematic circuit diagram of a power cell 400 including a MESFET and a resistor coupled to the source of the MESFET. Power amplifier cell 400 includes an enhancement NMOS 102 coupled in series to a MESFET 204 such that the drain of enhancement NMOS 102 has its drain coupled to the source of MESFET 204. Enhancement NMOS 102 is configured to provide the gain, $g_m$, for the power amplifier 400, and MESFET 204 is configured to function as a voltage buffer stage. Advantageously, the power amplifier cell 400 can be formed using CMOS processing technology.

Figure 4B:
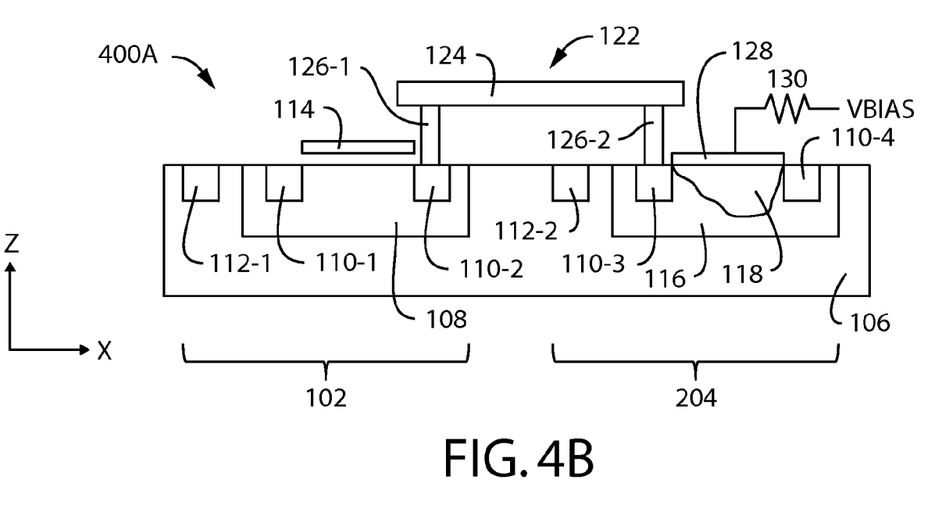
FIG. 4B is a cross-sectional view of one example of a power amplifier layout in accordance with the power amplifier illustrated in FIG. 4A.

FIG. 4B is a cross-sectional view of one example of a power cell 400A in accordance with the circuit diagram illustrated in FIG. 4A. As shown in FIG. 4B, enhancement NMOS 102 and MESFET 204 are formed in semiconductor substrate 106 such that enhancement NMOS 102 and MESFET 204 are spaced laterally (e.g., in the x-direction) from one another. In some embodiments, substrate 106 is a Hi-R substrate or a lightly doped p-type substrate. Substrate 106 can be formed from a variety of materials including, but not limited to, bulk silicon, SiP, SiGe, SiC, Ge, SOI-Si, SOI-Ge, or combinations thereof.

Enhancement NMOS 102 includes a first doped well 108 formed at and beneath the upper surface of substrate 106. In some embodiments, doped well 108 is doped with a p-type dopant such as, for example, boron, gallium, aluminum, or any Group III element. A pair of doped regions 110-1, 110-2 are formed in the upper surface of well 108 and are laterally spaced from one another. In some embodiments, doped regions 110-1, 110-2 are N+ doped regions that are doped using a suitable n-type dopant. Examples of a suitable n-type dopant include, but are not limited to, arsenic, phosphorus, antimony, or other Group V element. A P+ doped region 112-1 is located at and beneath an upper surface of substrate 106 and is spaced laterally (i.e., in the x-direction) from well 108. A gate structure 114 is located vertically above (i.e., in the z-direction) doped well 108. Gate structure 114 extends between doped regions 110-1 and 110-2 such that a channel region is formed in well 108 between doped regions 110-1 and 110-2. Doped regions 110-1, 110-2 form the source and drain regions of enhancement NMOS 102, respectively.

MESFET 204 includes a doped well 116 formed in the upper surface of substrate 106 and is laterally spaced from well 108. In some embodiments, well 116 is an n-well doped to a lower doping concentration than N+ doped regions 110-1, 110-2. A depletion region 118 is disposed between a pair of doped regions 110-3, 110-4, which are formed in the upper surface of well 116 such that doped regions 110-3, 110-4 are disposed on opposite sides of depletion region 118 and are spaced laterally from one another. In some embodiments, doped regions 110-3, 110-4 include N+ doped regions that are doped to a different concentration of an n-type dopant than the concentration to which well 116 is doped. Doped regions 110-3, 110-4 form the source and drain regions of enhancement depletion NMOS 104, respectively. A P+ doped region 112-2 is located in an upper surface of substrate 106 and is spaced laterally (i.e., in the x-direction) from well 116. A Schottky gate structure 128, which can be formed from a metal, is disposed on the upper surface of diffusion region 118 of doped well 116. In some embodiments, Schottky structure is formed from Ni, nickel (Ni), tungsten (W), polysilicon, copper (Cu), cobalt (Co), or titanium (Ti), to list only a few possible examples. Schottky gate 128 extends between doped regions 110-3 and 110-4 over depletion region 118, which serves as the channel of MESFET 204.

Enhancement NMOS 102 and MESFET 204 are coupled together electrically by an interconnect 122. For example, FIG. 4B illustrates one example of an interconnect 122 that couples together enhancement NMOS 102 and MESFET 204. Interconnect 122 includes a conductive trace 124 formed in a metal layer disposed over substrate 106 (e.g., M1, M2, M3, etc.) and a pair of vias 126-1, 126-2 that vertically extend between laterally extending conductive trace 124 and doped regions 110-2, 110-3, respectively.

A resistor 130 is coupled to Schottky structure 128 of MESFET 204. In some embodiments, resistor 130 has a resistance at or above 5 kΩ or 10 kΩ, although one of ordinary skill in the art will understand that resistor 130 can have other resistance values. Resistor 130 can include a floating gate structure (not shown) disposed above substrate 106.

Figure 4C:
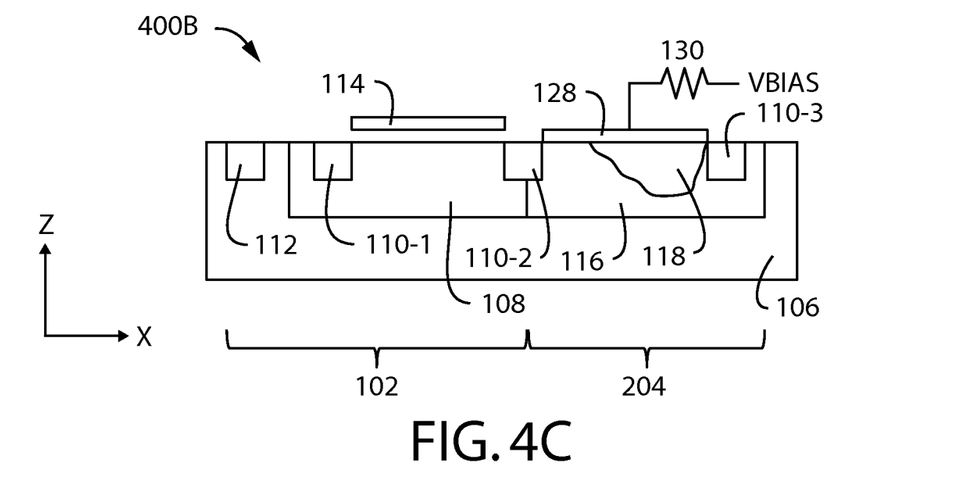
FIG. 4C is a cross-sectional view of another example of a power amplifier layout in accordance with the power amplifier illustrated in FIG. 4A.

Other layouts of power cells configured with MESFETs can be used to further reduce the substrate area of the power cell. For example, FIG. 2C is cross-sectional view of another example of a power amplifiers 400, which includes an enhancement NMOS 102 and a MESFET 204 disposed laterally adjacent to one another in an upper surface of a substrate 106. In some embodiments, substrate 106 is a Hi-R substrate or a lightly doped p-type substrate.

Enhancement NMOS 102 includes a doped well 108 formed at and beneath the upper surface of substrate 106. In some embodiments, doped well 108 is doped with a p-type dopant to a concentration in the range of $10^{15}$ to $10^{18}$ cm$^{-3}$. A doped region 110-1 is formed at and beneath the upper surface of well 108, and a second doped region 110-2 is formed at an interface of doped well 108 and doped well 116 such that doped regions 110-1, 110-2 are spaced laterally from one another. In some embodiments, doped regions 110-1, 110-2 are N+ doped regions that are doped using a suitable n-type dopant to a concentration in the range of $10^{17}$ to $10^{20}$ cm$^{-3}$ and form the source and drain regions of enhancement NMOS 102, respectively. A P+ doped region 112 is located in an upper surface of substrate 106 and is spaced laterally (i.e., in the x-direction) from well 108. In some embodiments, P+ doped region 112 is doped with a suitable p-type dopant to a concentration in the range of $10^{17}$ to $10^{20}$ cm$^{-3}$. A gate structure 114 is located vertically above (i.e., in the z-direction) doped well 108 and extends between doped regions 110-1 and 110-2 such that a channel region is formed in well 108 between contacts 110-1 and 110-2.

MESFET 204 is formed in a doped well 116 located at and beneath the upper surface of substrate 106. In some embodiments, well 116 is an n-well doped to a concentration of about $10^{15}$ to $10^{18}$ cm$^{-3}$ with a suitable n-type dopant. A depletion region 118 is disposed between doped regions 110-2, 110-3. Doped region 110-3 is formed at and beneath the upper surface of doped well 116 at a lateral distance from doped region 110-2, which is formed at the interface of doped well 108 and doped well 116. In some embodiments, doped region 110-3 is an N+ doped region that is doped with an n-type dopant to a concentration in the range of $10^{17}$ to $10^{-20}$ cm$^{-3}$. Doped regions 110-2, 110-3 form the source and drain regions of MESFET 204, respectively. A Schottky gate structure 128 is formed directly on the upper surface of substrate 106 over depletion region 118 of well 116. Schottky gate structure 128 extends between doped regions 110-2 and 110-3 over depletion region 118, which serves as the channel of MESFET 204. Doped region 110-2 serves as the drain of enhancement NMOS 102 and the source of MESFET 204.

A resistor 130 is coupled to Schottky structure 128 of MESFET 204. In some embodiments, resistor 130 has a resistance at or above 5 kΩ or 10 kΩ, although one of ordinary skill in the art will understand that resistor 130 can have other resistance values. Resistor 130 can include a floating gate structure (not shown) disposed above substrate 106.

Figure 4D:
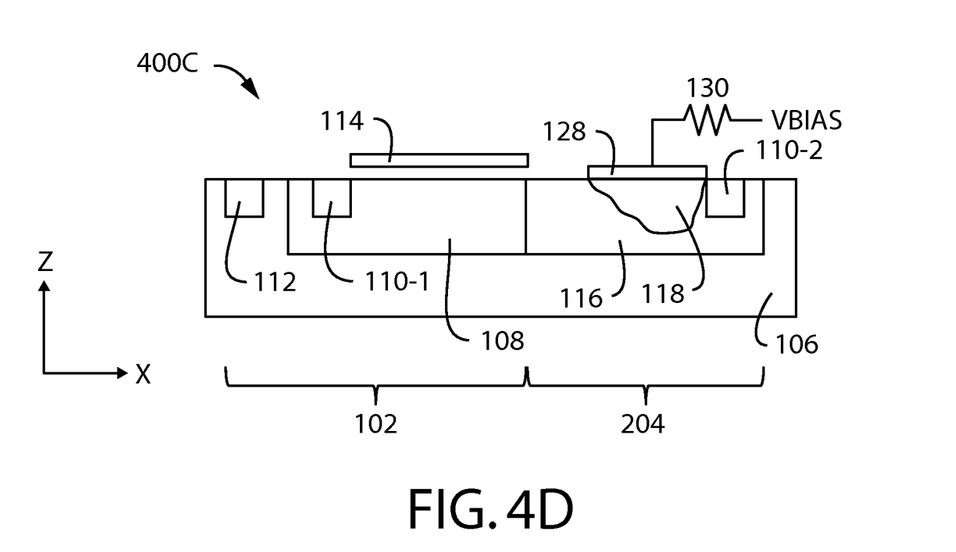
FIG. 4D is a cross-sectional view of another example of a power amplifier layout in accordance with the power amplifier illustrated in FIG. 4A.

FIG. 4D is a cross-sectional view of another example of a power cell 400C configured with a MESFET and resistor coupled to the gate of the MESFET. Enhancement NMOS 102 and MESFET 204 are disposed laterally adjacent to one another in an upper surface of a substrate 106, which can be a Hi-R substrate or a lightly doped p-type substrate in some embodiments.

Enhancement NMOS 102 is formed in a doped well 108 located at and beneath the upper surface of substrate 106. In some embodiments, doped well 108 is doped with a suitable p-type dopant. A doped region 110-1 is formed in the upper surface of well 108 and forms the source of enhancement NMOS 102. In some embodiments, doped region 110-1 is an N+ doped region that is doped using a suitable n-type dopant such as, for example, arsenic, phosphorus, antimony, or other Group V element. A P+ doped region 112 is located at and beneath an upper surface of substrate 106 and is spaced laterally (i.e., in the x-direction) from well 108. A gate structure 114 is located vertically above (i.e., in the z-direction) doped well 108 and extends between doped region 110-1 and the side of well 108 that abuts doped well 116 such that a channel region is formed in well 108 between doped region 110-1 and the interface between doped wells 108 and 116.

MESFET 204 is formed in a doped well 116 disposed at and beneath the upper surface of substrate 106 such that MESFET 204 is positioned directly adjacent to and abuts doped well 108. In some embodiments, well 116 is an n-well doped with a suitable n-type dopant. A depletion region 118 is formed in doped well 116 adjacent to a doped region 110-2. In some embodiments, doped region 110-2 is an N+ doped region that is doped with a suitable n-type dopant. Doped region 110-2 forms the drain region of MESFET 204. A Schottky gate structure 128 is formed directly on the upper surface of substrate 106 over the depletion region 118 of well 116.

A resistor 130 is coupled to Schottky structure 128 of MESFET 204. In some embodiments, resistor 130 has a resistance at or above 5 kΩ or 10 kΩ, although one of ordinary skill in the art will understand that resistor 130 can have other resistance values. Resistor 130 can include a floating gate structure (not shown) disposed above substrate 106.

Figure 5:
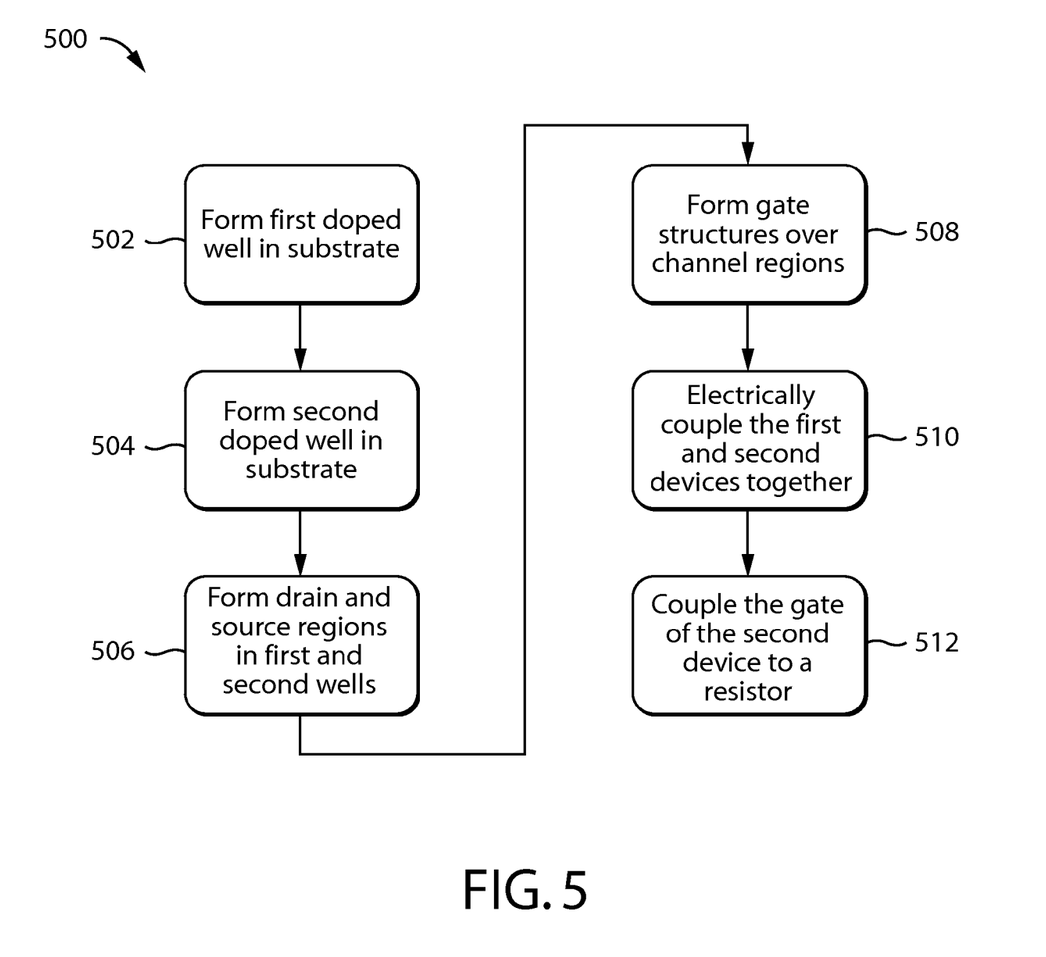
FIG. 5 is a flow diagram of one example of fabricating a power amplifier in accordance with some embodiments.

The disclosed power amplifiers described herein advantageously can be implemented using CMOS processing technology. FIG. 5 is a flow diagram of one example of a method 500 of forming a power amplifier in accordance with some embodiments. In some embodiments, method 500 is performed using exclusively CMOS processing.

At block 502, a first doped well is formed at and beneath an upper surface of a semiconductor substrate. In some embodiments, the substrate is a HiR substrate, e.g., is not doped, and in some embodiments, the substrate is a lightly doped p-type substrate. Forming the first doped well includes doping an area with a dopant of a first type. In some embodiments, the dopant is a suitable p-type substrate and the doping of first doped area includes doping the area to a concentration of $10^{15}$ to $10^{18}$ cm$^{-3}$. In some embodiments, the dopant is a suitable n-type dopant and the doping of the first doped area including doping the area to a concentration of $10^{15}$ to $10^{18}$ cm$^{-3}$.

At block 504, a second doped well is formed at and beneath an upper surface of the semiconductor substrate such that the second doped well is disposed adjacent to the first doped well. As described above, the first and second doped wells can be directly adjacent to one another such that they are in an abutting relationship, or the first and second doped wells can be spaced apart from one another. Forming the second doped well includes doping an area with a dopant of a second type. In some embodiments, the dopant is a suitable p-type substrate and the doping of first doped area includes doping the area to a concentration of $10^{15}$ to $10^{18}$ cm$^{-3}$. In some embodiments, the dopant is a suitable n-type dopant and the doping of the first doped area including doping the area to a concentration of $10^{15}$ to $10^{18}$ cm$^{-3}$.

At block 506, drain and source regions are formed in the first and second doped wells. In some embodiments, the drain and source regions are formed in the first and second doped wells by doping areas of the wells with a semiconductor dopant. For example, a first pair of N+ doped regions can be formed at and beneath the upper surfaces the first doped well such that they are laterally spaced from one another, and at least one additional N+ doped region can be formed in the second doped well. In some embodiments, a pair of N+ doped regions are formed in the second doped well at a distance from one another. In some embodiments, the N+ doped regions are formed by doping the regions with a suitable n-type dopant to a concentration in the range of $10^{17}$ to $10^{20}$ cm$^{-3}$.

At block 508, a first gate structure is formed over a channel region defined in the first doped well, and a second gate structure is formed over a channel region defined in the second doped well. In some embodiments, formation of the gate structure includes depositing a gate oxide over the channel region and then depositing a gate structure, such as a layer of polysilicon, over the gate oxide. In some embodiments, the gate structure is a Schottky gate that is formed by depositing a suitable Schottky metal over the channel region.

At optional block 510, the first and second devices are coupled together. In some embodiments, for example, the first device is an enhancement NMOS and the second device is a depletion NMOS. In some embodiments, the first device is an enhancement NMOS and the second device is a MESFET. The first and second devices can be coupled together by forming an interconnect structure in at least one metal layer formed over an upper surface of the semiconductor substrate. As described above, the first and second device can be coupled together by sharing a doped region formed at the interface between the first and second doped wells.

At optional block 512, a resistor is coupled to the gate of the second device. In some embodiments, the forming the resistor includes forming a floating gate structure over the semiconductor substrate.

Forming the power amplifiers using CMOS technology advantageously simplifies and improves the integration of the power amplifiers with other functional components. For example, the power amplifiers disclosed herein can be incorporated into multi-mode/multi-band ("MMMB") transceivers for worldwide wireless communication. The output power of these power amplifiers is suitable for such integration with limited reliability issues while at the same time requiring less implementation cost.

Figure 6:
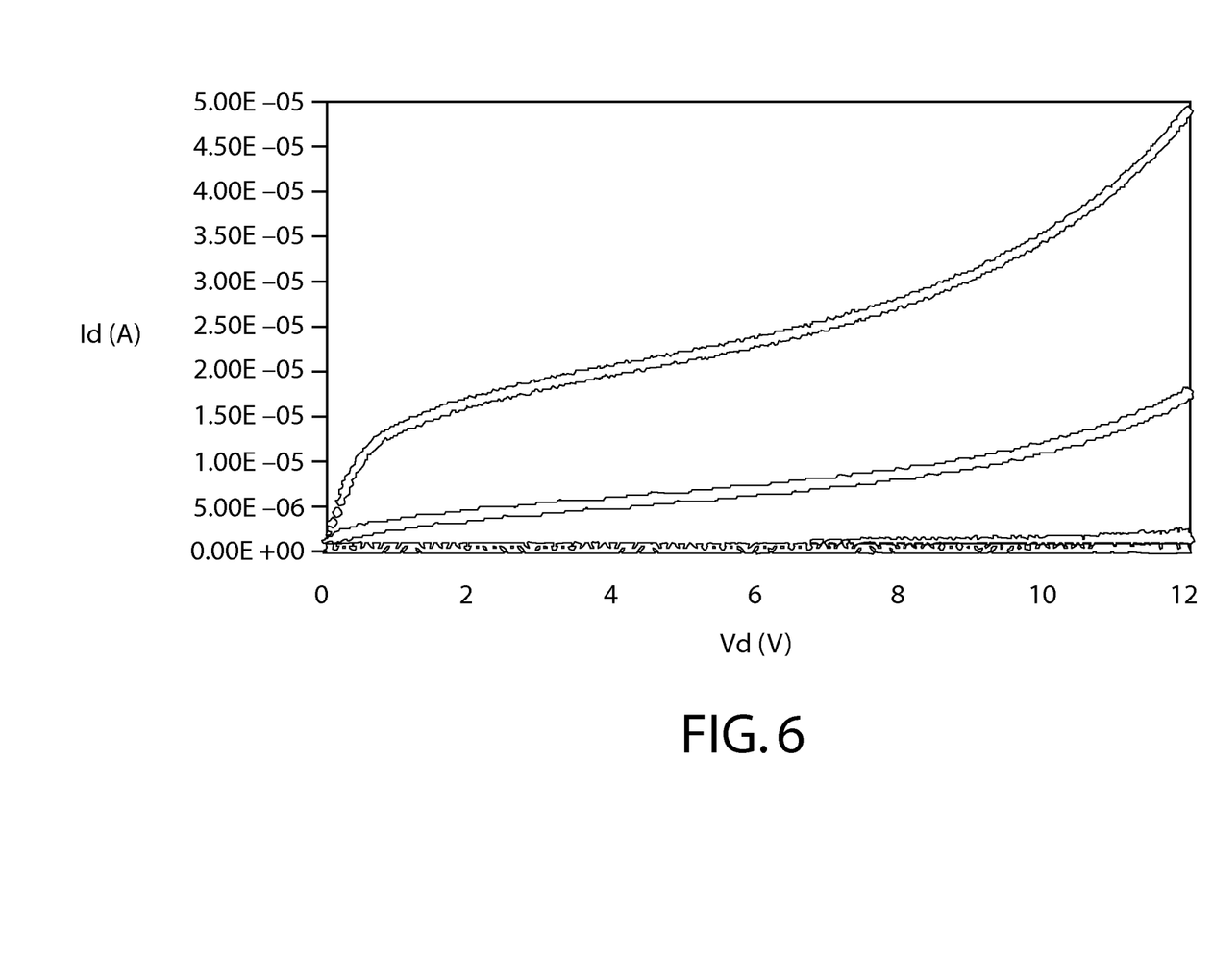
FIG. 6 is a simulated I-V curve of a power amplifier in accordance with some embodiments.

FIG. 6 is a simulated I-V curve illustrating the pinch off performance of a MESFET 204 implemented using CMOS processing in accordance with some embodiments. As shown in FIG. 6, the breakdown voltage of the MESFET 204 is greater than 12 volts. The impressive performance of the MESFET is achieved by locating the pinch-off point way from a gate oxide and less channel electric field near an Si/SiO$_2$ surface, which reduces the hot carrier effect. The use of a thick gate oxide for a depletion NMOS 104 can also achieve high breakdown voltages. In embodiments when a Schottky gate structure is implemented, the implementation of a resistor coupled to the Schottky gate alleviates the Schottky diode turn on.

In some embodiments, a power amplifier includes a first complementary metal oxide semiconductor ("CMOS") device configured to form a gain stage of the power amplifier and a second CMOS device configured to form a voltage buffer stage of the power amplifier. The first CMOS device includes a first doped well of a first type formed in an upper surface of a semiconductor substrate, a first drain region and a first source region spaced laterally from one another in an upper surface of the first doped well, and a first gate structure formed over a first channel region defined between the first drain region and the first source region in the first doped well of the first type. The second CMOS device includes a first doped well of a second type formed in an upper surface of the semiconductor substrate such that the first doped well of the second type is disposed adjacent to the first doped well of the first type. A second drain region and a second source region are spaced laterally from one another in an upper surface of the first doped well of the second type, and a second gate structure is formed over a second channel region defined between the second drain region and the second source region in the first doped well of the second type. The second source region is coupled to the first drain region.

In some embodiments, the first doped well of the second type is spaced laterally from the first doped well of the second type.

In some embodiments, the first drain region and the first source region are formed in respective doped regions of the second type in the first doped well of the first type, and the second drain region and the second source region are formed in respective doped regions of the second type in the first doped well of the second type.

In some embodiments, the first CMOS device is an enhancement NMOS, and the second CMOS device is a depletion NMOS.

In some embodiments, the first gate structure and the second gate structure are polysilicon gate structures.

In some embodiments, a resistor is coupled to the second gate structure.

In some embodiments, the first CMOS device is an enhancement NMOS, and the second CMOS device is a MESFET.

In some embodiments, the first gate structure is a polysilicon gate structure, and the second gate structure is a Schottky gate structure.

In some embodiments, a resistor is coupled to the Schottky gate structure.

In some embodiments, the first doped well of the second type is disposed directly adjacent to the first doped well of the first type such that the first doped well of the second type abuts the first doped well of the first type.

In some embodiments, the first drain region and the first source region are formed in respective doped regions of the second type in the first doped well of the first type, and the second drain region and the second source region are formed in respective doped regions of the second type in the first doped well of the second type.

In some embodiments, the first CMOS device is an enhancement NMOS, and the second CMOS device is a depletion NMOS.

In some embodiments, the first gate structure and the second gate structure are polysilicon gate structures.

In some embodiments, a resistor is coupled to the second gate structure.

In some embodiments, the first CMOS device is an enhancement NMOS, and the second CMOS device is a MESFET.

In some embodiments, the first gate structure is a polysilicon gate structure, and the second gate structure is a Schottky gate structure.

In some embodiments, a resistor is coupled to the Schottky gate structure.

In some embodiments, a method includes forming a first CMOS device configured to form a gain stage of a power amplifier, forming a second CMOS device configured to form a voltage buffer stage of the power amplifier. Forming the first CMOS device includes doping a first area in an upper surface of a semiconductor substrate with a dopant of a first type to form a first well of a first type in the upper surface of the semiconductor substrate, doping a first region and a second region in an upper surface of the first well of the first type with a dopant of a second type to form a first drain region and a first source region that are laterally spaced from each other, and forming a gate structure above the upper surface of the first well of the first type. Forming the second CMOS device includes doping a second area in the upper surface of the semiconductor substrate with a dopant of the second type to form a first well of the second type in the upper surface of the semiconductor substrate adjacent to the first well of the first type, doping at least one third region in an upper surface of the first well of the second type with a dopant of the second type to form a second drain region and a second source region that are laterally spaced from each other, and forming a second gate structure above the upper surface of the first well of the second type. The second source region is coupled to the first drain region to form the power amplifier.

In some embodiments, a power amplifier includes an enhancement NMOS transistor configured to form a gain stage of the power amplifier and a CMOS device configured to form a voltage buffer stage of the power amplifier. The enhancement NMOS transistor includes a first doped well of a first type formed in an upper surface of a semiconductor substrate, a first drain region and a first source region spaced laterally from one another in an upper surface of the first doped well, and a first gate structure formed over a first channel region defined between the first drain region and the first source region in the first doped well of the first type. The CMOS device includes a first doped well of a second type formed in an upper surface of the semiconductor substrate such that the first doped well of the second type is disposed adjacent to the first doped well of the first type, a second drain region and a second source region spaced laterally from one another in an upper surface of the first doped well of the first type, and a second gate structure formed over a second channel region defined between the second drain region and the second source region in the first doped well of the second type. The second source region is coupled to the first drain region.

In some embodiments, the CMOS device is one of a depletion NMOS or a MESFET.

Although the devices, circuits, and methods have been described in terms of exemplary embodiments, they are not limited thereto. Rather, the appended claims should be construed broadly, to include other variants and embodiments of the devices, circuits, and methods, which may be made by those skilled in the art without departing from the scope and range of equivalents of the devices, circuits, and methods.

What is claimed is:

1. A power amplifier, comprising:
   a first complementary metal oxide semiconductor ("CMOS") device configured to form a gain stage of the power amplifier, the first CMOS device including:
      a first doped well of a first type formed in an upper surface of a semiconductor substrate,
      a first drain region and a first source region spaced laterally from one another in an upper surface of the first doped well, and
      a first gate structure formed over a first channel region defined between the first drain region and the first source region in the first doped well of the first type; and
   a second CMOS device configured to form a voltage buffer stage of the power amplifier, the second CMOS device including:
      a first doped well of a second type formed in an upper surface of the semiconductor substrate such that the first doped well of the second type is disposed adjacent to the first doped well of the first type,
      a second drain region and a second source region spaced laterally from one another in an upper surface of the first doped well of the second type, and
      a second gate structure formed over a second channel region defined between the second drain region and the second source region in the first doped well of the second type,
   wherein the second source region is coupled to the first drain region.

2. The power amplifier of claim 1, wherein the first doped well of the second type is spaced laterally from the first doped well of the second type.

3. The power amplifier of claim 2, wherein the first drain region and the first source region are formed in respective doped regions of the second type in the first doped well of the first type, and the second drain region and the second source region are formed in respective doped regions of the second type in the first doped well of the second type.

4. The power amplifier of claim 3, wherein the first CMOS device is an enhancement NMOS, and the second CMOS device is a depletion NMOS.

5. The power amplifier of claim 4, wherein the first gate structure and the second gate structure are polysilicon gate structures.

6. The power amplifier of claim 5, wherein a resistor is coupled to the second gate structure.

7. The power amplifier of claim 3, wherein the first CMOS device is an enhancement NMOS, and the second CMOS device is a MESFET.

8. The power amplifier of claim 7, wherein the first gate structure is a polysilicon gate structure, and the second gate structure is a Schottky gate structure.

9. The power amplifier of claim 8, wherein a resistor is coupled to the Schottky gate structure.

10. The power amplifier of claim 1, wherein the first doped well of the second type is disposed directly adjacent to the first doped well of the first type such that the first doped well of the second type abuts the first doped well of the first type.

11. The power amplifier of claim 10, wherein the first drain region and the first source region are formed in respective doped regions of the second type in the first doped well of the first type, and the second drain region and the second source region are formed in respective doped regions of the second type in the first doped well of the second type.

12. The power amplifier of claim 11, wherein the first CMOS device is an enhancement NMOS, and the second CMOS device is a depletion NMOS.

13. The power amplifier of claim 12, wherein the first gate structure and the second gate structure are polysilicon gate structures.

14. The power amplifier of claim 13, wherein a resistor is coupled to the second gate structure.

15. The power amplifier of claim 11, wherein the first CMOS device is an enhancement NMOS, and the second CMOS device is a MESFET.

16. The power amplifier of claim 15, wherein the first gate structure is a polysilicon gate structure, and the second gate structure is a Schottky gate structure.

17. The power amplifier of claim 16, wherein a resistor is coupled to the Schottky gate structure.

18. A method, comprising:
forming a first complementary oxide semiconductor ("CMOS") device configured to form a gain stage of a power amplifier, including the steps of:
 doping a first area in an upper surface of a semiconductor substrate with a dopant of a first type to form a first well of a first type in the upper surface of the semiconductor substrate,
 doping a first region and a second region in an upper surface of the first well of the first type with a dopant of a second type to form a first drain region and a first source region that are laterally spaced from each other, and
 forming a first gate structure above the upper surface of the first well of the first type; and
forming a second complementary oxide semiconductor ("CMOS") device configured to form a voltage buffer stage of the power amplifier, including the steps of:
 doping a second area in the upper surface of the semiconductor substrate with a dopant of the second type to form a first well of the second type in the upper surface of the semiconductor substrate adjacent to the first well of the first type,
 doping at least one third region in an upper surface of the first well of the second type with a dopant of the second type to form a second drain region and a second source region that are laterally spaced from each other, and
 forming a second gate structure above the upper surface of the first well of the second type; and
coupling the second source region to the first drain region to form the power amplifier.

19. A power amplifier, comprising:
an enhancement NMOS transistor configured to form a gain stage of the power amplifier, the enhancement NMOS transistor including:
 a first doped well of a first type formed in an upper surface of a semiconductor substrate,
 a first drain region and a first source region spaced laterally from one another in an upper surface of the first doped well, and
 a first gate structure formed over a first channel region defined between the first drain region and the first source region in the first doped well of the first type; and
a CMOS device configured to form a voltage buffer stage of the power amplifier, the CMOS device including:
 a first doped well of a second type formed in an upper surface of the semiconductor substrate such that the first doped well of the second type is disposed adjacent to the first doped well of the first type,
 a second drain region and a second source region spaced laterally from one another in an upper surface of the first doped well of the first type, and
 a second gate structure formed over a second channel region defined between the second drain region and the second source region in the first doped well of the second type,
wherein the second source region is coupled to the first drain region.

20. The power amplifier of claim 19, wherein the CMOS device is one of a depletion NMOS or a MESFET.

\* \* \* \* \*